(12) United States Patent
Matano et al.

(10) Patent No.: US 8,470,123 B2
(45) Date of Patent: Jun. 25, 2013

(54) PRESSURE SENSITIVE ADHESIVE FOR STICKING AN ELECTROMAGNETIC WAVE-SHIELDING FILM AND AN OPTICALLY FUNCTIONAL FILM, AND A DISPLAY PANEL FILTER ELEMENT CONTAINING SAME

(75) Inventors: Tadashi Matano, Urayasu (JP); Shin Koizumi, Tokyo (JP); Mikihiro Kashio, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/560,588

(22) Filed: Jul. 27, 2012

(65) Prior Publication Data

US 2012/0312592 A1    Dec. 13, 2012

Related U.S. Application Data

(63) Continuation of application No. 11/675,991, filed on Feb. 16, 2007, now abandoned.

(30) Foreign Application Priority Data

Feb. 17, 2006  (JP) ................................. 2006-040281
Nov. 13, 2006  (JP) ................................. 2006-306241

(51) Int. Cl.
  *C04B 37/00*  (2006.01)
  *B32B 7/12*  (2006.01)
  *H05K 9/00*  (2006.01)

(52) U.S. Cl.
  USPC ........................... 156/325; 156/327; 174/350

(58) Field of Classification Search
  USPC .................... 156/325, 327; 174/350
  See application file for complete search history.

(56) References Cited

U.S. PATENT DOCUMENTS

| | | |
|---|---|---|
| 4,902,440 A | 2/1990 | Takeyama et al. |
| 5,334,686 A | 8/1994 | Ando et al. |
| 5,905,099 A | 5/1999 | Everaerts et al. |
| 6,123,799 A | 9/2000 | Ohura et al. |
| 7,208,206 B2 | 4/2007 | Hieda et al. |
| 7,285,843 B2 | 10/2007 | Arakawa et al. |
| 7,449,768 B2 | 11/2008 | Arakawa et al. |
| 2002/0054262 A1 | 5/2002 | Kitagawa et al. |
| 2003/0142486 A1 | 7/2003 | Arakawa et al. |
| 2003/0216519 A1 | 11/2003 | Heilmann et al. |
| 2006/0108050 A1 | 5/2006 | Satake et al. |
| 2006/0128925 A1 | 6/2006 | Arai et al. |
| 2006/0154092 A1 | 7/2006 | Naito et al. |

FOREIGN PATENT DOCUMENTS

| | | |
|---|---|---|
| CN | 1201478 A | 12/1998 |
| CN | 1433263 A | 7/2003 |
| CN | 1538223 A | 10/2004 |
| JP | 2003336013 | 11/2003 |
| JP | 2003336013 A | 11/2003 |
| JP | 2004022784 A | 1/2004 |
| JP | 2005239878 A | 9/2005 |
| JP | 2005325250 | 11/2005 |
| JP | 2005325250 A | 11/2005 |
| TW | 1240233 B | 7/1993 |
| WO | 2004038464 A1 | 5/2004 |

*Primary Examiner* — Michael Orlando

(74) *Attorney, Agent, or Firm* — Heslin Rothenberg Farley & Mesiti P.C.; Andrew K. Gonsalves

(57) ABSTRACT

A pressure sensitive adhesive for sticking together an electromagnetic wave-shielding film and optically functional film, wherein a storage elastic modulus at 70° C. is $7.00 \times 10^4$ Pa or more; and a display panel filter element comprising (1) an electromagnetic wave-shielding film, the film being a laminate of a transparent substrate film, an adhesive for a metal foil, which is applied on one surface of the transparent substrate film, and a metal foil mesh formed on the adhesive for a metal foil, (2) a layer of the pressure sensitive adhesive according to (1), which is applied so as to cover the metal foil mesh of the electromagnetic wave-shielding film, and (3) an optically functional film provided on the pressure sensitive adhesive, are provided. The pressure sensitive adhesive exhibits sufficient adhesive strength, can be filled into the inside of the pores of the metal foil mesh, and does not generate bubbles in a heating treatment.

6 Claims, No Drawings

PRESSURE SENSITIVE ADHESIVE FOR STICKING AN ELECTROMAGNETIC WAVE-SHIELDING FILM AND AN OPTICALLY FUNCTIONAL FILM, AND A DISPLAY PANEL FILTER ELEMENT CONTAINING SAME

CROSS-REFERENCE TO RELATED APPLICATIONS

This application is a continuation of U.S. patent application Ser. No. 11/675,991, filed Feb. 16, 2007, published as U.S. Patent Publication No. US-2007/0196646-A1 on Aug. 23, 2007, which claims the priority benefit of Japanese Patent Application No. JP 2006-306241, filed Nov. 13, 2006, and Japanese Patent Application No. JP 2006-040281, filed Feb. 17, 2006, the disclosures of which are hereby incorporated by reference in their entirety.

BACKGROUND OF THE INVENTION

1. Field of the Invention

The present invention relates to a pressure sensitive adhesive for sticking an electromagnetic wave-shielding film and an optically functional film, and a display panel filter element containing the same. The pressure sensitive adhesive according to the present invention can be used for the manufacture of a display panel filter element constituting, for example, a plasma display panel or the like.

2. Description of the Related Art

It is believed that an electromagnetic wave emitted from an electromagnetic device such as a plasma display affects not only other electromagnetic devices, but also the human body. Particularly, an electromagnetic wave having a frequency of 30 MHz to 130 MHz is emitted from a plasma display, and may affect computers and computer peripherals positioned therearound. Accordingly, the emitted electromagnetic wave should be prevented from leaking toward the outside. An electromagnetic wave may be shielded, for example, by a method of covering an emitting source with a case formed from a highly conductive material, or a method of applying a conductive net on the emitting source. However, an apparatus such as a plasma display, which must be observed, requires transmittability, and the above methods cannot be adopted.

Therefore, in a plasma display or the like, an electromagnetic wave-shielding sheet composed of a transparent substrate film and a metal foil mesh carried thereon via an adhesive layer is used as a means having not only transmittability but also a property of shielding an electromagnetic wave. The metal foil mesh is formed by mounting a metal foil on the transparent substrate film via the adhesive layer, and forming pores by etching the metal foil. The electromagnetic wave-shielding film, which is a laminate of the transparent substrate film, the adhesive layer, and the metal foil mesh, can provide a required shielding property by appropriately adjusting a thickness of the metal foil or a size of the mesh pores, even if the strength of an emitted electromagnetic wave is high as in a plasma display. Further, it also has a sufficient transparency to assure a visibility of the display screen (see, for example Patent Document No. 1).

The electromagnetic wave-shielding film is stuck together with various optically functional films, such as a near infrared light-absorbing film, an ultraviolet light-absorbing film, or an antireflective film by a pressure sensitive adhesive applied onto the metal foil mesh on the surface of the electromagnetic wave-shielding film. After sticking together the electromagnetic wave-shielding film and the optically functional film, an autoclaving treatment is generally carried out under a pressure of about 0.3 to 1.5 MPa at about 40 to 80° C. In the autoclaving treatment as above, the inside of the pores of the metal foil mesh having a fine concave-convex surface structure is entirely filled with the pressure sensitive adhesive under pressure, to entirely exclude bubbles; this property will be hereinafter sometimes referred to as the "filling-in property". Further, the pressure sensitive adhesive used in the above sticking must have a sufficient adhesive strength between the metal foil mesh on the surface of the electromagnetic wave-shielding film and the optically functional film, and a sufficient adhesive strength between the optically functional film and the adhesive layer (for the metal foil) exposed in the pores of the metal foil mesh so that a separation of the electromagnetic wave-shielding film from the optically functional film is prevented.

[Patent Document No. 1] Japanese Unexamined Patent Publication No. 2003-188576.

SUMMARY OF THE INVENTION

However, pressure sensitive adhesives conventionally used to stick together the electromagnetic wave-shielding film and various optically functional films have defects in that the adhesive strength is insufficient, it does not entirely fill the inside of the pores of the metal foil mesh under pressure, or bubbles are generated during a heat treatment.

The inventors of the present invention found that, in the particular application of a pressure sensitive adhesive for sticking together an electromagnetic wave-shielding film and an optically functional film, a high adhesive strength can be obtained by adjusting viscoelastic parameters of the pressure sensitive adhesive within a particular scope.

Accordingly, the object of the present invention is to provide a pressure sensitive adhesive which exhibits a sufficient adhesive strength, can be entirely filled into the inside of the pores of the metal foil mesh under pressure, and does not generate bubbles during a heat treatment, in the sticking together of an electromagnetic wave-shielding film and various optically functional films.

Other objects and advantages of the present invention will be apparent from the following description.

In accordance with the present invention, there is provided a pressure sensitive adhesive for sticking together an electromagnetic wave-shielding film and an optically functional film, wherein a storage elastic modulus at 70° C. is $7.00 \times 10^4$ Pa or more.

In accordance with a preferable embodiment of the pressure sensitive adhesive of the present invention, a storage elastic modulus at 23° C. is $1.00 \times 10^5$ Pa or more.

In accordance with another preferable embodiment of the pressure sensitive adhesive of the present invention, a peak temperature of loss tangent (tan δ) is −15° C. or more.

In accordance with still another preferable embodiment of the pressure sensitive adhesive of the present invention, it comprises an acrylic copolymer containing (meth)acrylic alkyl ester monomers, and optionally further containing nitrogen-containing vinyl monomers, as comonomers. In accordance with still another preferable embodiment, the acrylic copolymer does not contain an acid comonomer.

Further, the present invention also relates to a display panel filter element comprising (1) an electromagnetic wave-shielding film, the film being a laminate of a transparent substrate film, an adhesive for a metal foil, which is applied on one surface of the transparent substrate film, and a metal foil mesh formed on the adhesive for a metal foil, (2) a layer of the pressure sensitive adhesive, which is applied so as to cover the metal foil mesh of the electromagnetic wave-shielding film, and (3) an optically functional film provided on the pressure sensitive adhesive.

The pressure sensitive adhesive of the present invention can be entirely filled into the inside of the pores of the metal foil mesh under heating and pressed, and has a durability under an elevated temperature and a high humidity condition, by adjusting the storage elastic modulus at an autoclaving treatment of 70° C. within a particular scope.

The pressure sensitive adhesive of the present invention also has a higher storage elastic modulus at a normal temperature of 23° C. in comparison with conventional pressure sensitive adhesives, and therefore, exhibits good adhesive properties to the surface of the metal foil mesh on the electromagnetic wave-shielding film.

Further, the pressure sensitive adhesive of the present invention has an excellent corrosion resistance, and therefore, the metal foil mesh is not corroded when applied on the electromagnetic wave-shielding film.

DESCRIPTION OF THE PREFERRED EMBODIMENTS

A pressure sensitive adhesive has viscoelasticity, and thus shows a viscous behavior and an elastic behavior. As viscoelastic parameters quantitatively representing viscoelasticity, the storage elastic modulus (G'), loss elastic modulus (G"), and loss tangent (tan δ) are widely used. The storage elastic modulus is defined as a ratio of elastic stresses at the same phase of strain, and is associated with a capability of the material to elastically store an energy. The loss elastic modulus is a ratio at a different phase of strain, and corresponds to a capability of the material to dissipate a stress as heat. Further, the ratio (G"/G') of the above elastic moduli is defined as a loss tangent (tan δ), and represents a ratio of a viscous component to an elastic component in the material. These viscoelastic parameters can be determined by an apparatus for measuring dynamic viscoelasticity.

The storage elastic modulus at 70° C. of the pressure sensitive adhesive of the present invention is $7.00\times10^4$ Pa or more, preferably $8.00\times10^4$ Pa or more, more preferably $9.00\times10^4$ Pa or more. The temperature of 70° C. is a typical temperature at which an electromagnetic wave-shielding film and an optically functional film are stuck together in an autoclave. If the storage elastic modulus (G') at 70° C. is less than $7.00\times10^4$ Pa, durability in the particular application according to the present invention may be deteriorated under an elevated temperature and a high humidity. An upper limit of the storage elastic modulus (G') at 70° C. does not exist. In the particular application according to the present invention, however, if the pressure sensitive adhesive becomes too hard, the pressure at the autoclaving treatment must be increased so that the pressure sensitive adhesive is applied over the metal foil mesh on the surface of the electromagnetic wave-shielding film, and the inside of the pores of the metal foil mesh having a fine concave-convex surface structure is entirely filled with the pressure sensitive adhesive. In this regard, the upper limit of the storage elastic modulus at 70° C. may be preferably $1.00\times10^6$ Pa.

The storage elastic modulus (G') at 23° C. of the pressure sensitive adhesive of the present invention is preferably $1.00\times10^5$ Pa or more, more preferably $1.50\times10^5$ Pa or more, most preferably $2.00\times10^5$ Pa or more. If the storage elastic modulus (G') at 23° C. is less than $1.00\times10^5$ Pa, the adhesive strength between the electromagnetic wave-shielding film and the optically functional film may be insufficient in the particular application according to the present invention. There is not a particular upper limit of the storage elastic modulus (G') at 23° C. In the particular application according to the present invention, however, if the storage elastic modulus at 23° C. (G') becomes too high, the sticking abilities are reduced. In this regard, the upper limit of the storage elastic modulus at 23° C. may be preferably $1.00\times10^6$ Pa.

The peak temperature of loss tangent (tan δ) of the pressure sensitive adhesive of the present invention is preferably −15° C. or more, more preferably −12° C. or more. If the peak temperature is less than −15° C., it might be difficult to obtain a desired adhesive strength. There is not a particular upper limit of the peak temperature of loss tangent (tan δ). However, if the peak temperature of loss tangent becomes too high, sticking abilities are reduced. In this regard, the upper limit of the peak temperature of loss tangent may be preferably 30° C.

The adhesive strength of the pressure sensitive adhesive of the present invention is preferably 20 to 50 N/25 mm, more preferably 22 to 45 N/25 mm, under the conditions shown in Examples as mentioned below.

A preferable example of the pressure sensitive adhesive of the present invention is an acrylic copolymer containing (meth)acrylic alkyl ester monomers as a comonomer, particularly an acrylic copolymer containing (meth)acrylic alkyl ester monomers and nitrogen-containing vinyl monomers as a comonomer. A ratio of the nitrogen-containing vinyl monomers to all the comonomers contained the acrylic copolymer is preferably 0.1-30.0% by mass, more preferably 3-30% by mass, most preferably 4-25% by mass. Hereinafter, a mixture of monomers constituting the acrylic copolymer is referred to as a monomer mixture. If an amount of the nitrogen-containing vinyl monomers used is less than 0.1% by mass, the adhesive strength may become extremely low. If an amount of the nitrogen-containing vinyl monomers used is more than 30% by mass, the filling-in property may be deteriorated.

The (meth)acrylic alkyl ester monomer is, for example, an alkyl acrylate or alkyl methacrylate containing an alkyl ester moiety having 1 to 20 carbon atoms, preferably 1 to 12 carbon atoms. Specifically, there may be mentioned methyl (meth)acrylate, ethyl (meth)acrylate, propyl (meth)acrylate, n-butyl (meth)acrylate, iso-butyl (meth)acrylate, t-butyl (meth)acrylate, pentyl (meth)acrylate, hexyl (meth)acrylate, cyclohexyl (meth) acrylate, 2-ethylhexyl (meth) acrylate, isooctyl (meth) acrylate, decyl (meth)acrylate, dodecyl (meth)acrylate, myristyl (meth)acrylate, palmityl (meth)acrylate, or stearyl (meth) acrylate. The (meth)acrylic alkyl ester monomer as above may be used alone or in combination thereof.

One or more of the (meth)acrylic alkyl ester monomer as above may be used at an amount of preferably 70-97% by mass, more preferably 75-95% by mass, in the monomer mixture. If the amount of the (meth)acrylic alkyl ester monomer is less than 70% by mass, the filling-in property may be deteriorated. If an amount of the (meth)acrylic alkyl ester monomer is more than 97% by mass, the adhesive strength may become extremely low.

It is preferable that the monomer mixture, which is a mixture of constitutional components of the acrylic copolymer, further contains monomers containing one or more cross-linking functional groups in a molecule. The cross-linking functional group may be, for example, a hydroxyl group, an amide group, an amino group, a carboxyl group, or a carbon-carbon unsaturated bond. A hydroxy group, an amide group, an amino group or a carboxyl group is reacted with a cross-linking agent to form a cross-linked structure, whereas an addition reaction of carbon-carbon unsaturated bonds forms a cross-linked structure. As the monomer containing a cross-linking functional group in a molecule, there may be mentioned, for example, a hydroxyalkyl (meth)acrylate, such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth) acrylate, 4-hydroxybutyl (meth) acrylate; an acrylamide, such as acrylamide, methacrylamide, N-methyl acrylamide, N-methylmethacrylamide, N-methylolacrylamide, N-methylolmethacrylamide•• a monoalkylaminoalkyl (meth)acrylate, such as monomethylaminoethyl (meth)acrylate, monoethylaminoethyl (meth) acrylate, monomethylaminopropyl (meth) acrylate, monoethylaminopropyl (meth)acrylate••an ethylenic unsaturated carboxylic acid, such as acrylic acid, methacrylic acid, crotonic acid, maleic acid, itaconic acid, citraconic acid. The monomer containing a cross-linking functional group in a molecule as above may be used alone or in a combination thereof. The group containing one or more carbon-carbon unsaturated bonds is for example a (meth)acryloyl group. Preferably, the cross-linking functional group-containing monomer does not contain an acid component, from a standpoint of a suppression of corrosion of the metal foil mesh, and thus, hydroxyalkyl (meth)acrylate is particularly preferable.

The cross-linking functional group-containing monomer can be used at an amount of, preferably 0-10% by mass, more preferably 0.2-5% by mass, in the monomer mixture.

As the nitrogen-containing vinyl monomer, there may be mentioned, for example, (meth)acrylamide, N-tert-butylacrylamide, N-vinylpyrrolidone, N,N-dimethylacrylamide, N,N-diethylacrylamide, N,N-dimethylaminopropylacrylamide, N-isopropylacrylamide, N-phenylacrylamide, dimethylaminopropylacrylamide, N-vinylcaprolactam, acryloyl morpholine, dimethylaminoethyl acrylate, or acryloylpiperidine.

Of these vinyl monomers as above, it is preferable to use a nitrogen-containing vinyl monomer having a glass-transition temperature (Tg) of 80° C. or more, more preferably 110° C. or more as a glass-transition temperature of a corresponding homopolymer. As an example of such a nitrogen-containing vinyl monomer, there may be mentioned acrylamide (119° C.), methacrylamide (171° C.), N-tert-butylacrylamide (135° C.), N,N-dimethylacrylamide (119° C.), N,N-dimethylaminopropylacrylamide (119° C.), N-isopropylacrylamide (134° C.), N-phenylacrylamide (160° C.), acryloyl morpholine (145° C.), or acryloylpiperidine (116° C.), and acryloyl morpholine, or N,N-dimethylacrylamide is particularly preferable. The temperature shown in brackets is a glass-transition temperature of the corresponding homopolymer.

The nitrogen-containing vinyl monomer also may be the cross-linking functional group-containing monomer.

The acrylic copolymer may optionally contain other monomers such as vinyl acetate or styrene, as a comonomer.

The acrylic copolymer can be prepared, for example, by any known polymerization methods, such as a solution polymerization or a mass polymerization from the monomer mixture containing the (meth)acrylic alkyl ester monomers and the nitrogen-containing vinyl monomers. The weight-average molecular weight thereof is preferably about 200 to 1800 thousands, more preferably 500 to 1500 thousands.

Preferably, the acrylic copolymer is cross-linked with a cross-linking agent. As the cross-linking agent, there may be mentioned, for example, a polyisocyanate compound, a metal chelate compound, or an epoxy compound, and the polyisocyanate compound is preferable. As the polyisocyanate compound, there may be mentioned, for example, a compound containing two or more isocyanate groups, such as, tolylene diisocyanate or a hydride thereof, an adduct of tolylene diisocyanate with trimethylolpropane, triphenylmethane triisocyanate, methylene-bis-di-phenylisocyanate or a hydride thereof, hexamethylene diisocyanate, an adduct of hexamethylene diisocyanate with trimethylolpropane, xylylenediisocyanate, an adduct of xylenediisocyanate with trimethylolpropane, 4,4'-dicyclohexylmethane diisocyanate, or polymerization product thereof. An amount of the cross-linking agent used is not particularly limited, but generally, is 0.01 to 10 parts by mass with respect to 100 parts by mass of the acrylic copolymer.

The pressure sensitive adhesive of the present invention may contain, in addition to the acrylic copolymer as above, for example, a tackifier resin such as petroleum resin, terpene resin, rosin resin, coumarone-indene resin or phenol resin, antioxidant, ultraviolet absorber, light stabilizer, softening agent, anticorrosive agent, or silane coupling agent or filler, or other appropriate additives, so long as the object of the present invention is not inhibited.

Further, the pressure sensitive adhesive of the present invention can contain a near infrared ray adsorbing agent, a neon light shielding agent, dyestuff, pigment or the like to prevent or alleviate an emission of various optical radiations, such as near infrared ray or neon light, from the plasma display.

As the near infrared ray adsorbing agent, there may be mentioned, for example, a colorant, such as a colorant of cyanines, thiols, metal complexes, an azo compound, polymethines, diphenyl methanes, triphenyl methanes quinines or diimmonium salt. Two or more agents as mentioned above can be generally used in combination in accordance with the wavelengths of two or more near infrared rays emitted from the plasma display. As the neon light shielding agent, there may be mentioned, for example, a cyanine compound, a squalium compound, an azomethine compound, a xanthene compound, or an oxonol compound.

The pressure sensitive adhesive of the present invention is used for sticking together the electromagnetic wave-shielding film and the optically functional film, as mentioned above. The electromagnetic wave-shielding film may be a laminate of (1) a transparent substrate film,
(2) an adhesive for a metal foil, which is applied on one surface of the transparent substrate film, and
(3) a metal foil mesh formed on the adhesive for a metal foil.

As the transparent substrate film, a film of an acrylic resin, a polycarbonate resin, a polypropylene resin, a polyethylene resin, a polystyrene resin, a polyester resin, a cellulose resin, a polysulfone resin, a polyvinyl chloride resin or the like may be used. Generally, it is preferable to use a film of a polyester resin such as polyethylene terephthalate resin, in view of its excellent mechanical strength and high transparency. The thickness of the transparent substrate film is not particularly limited, but preferably is about 50 μm to 200 μm in view of the mechanical strength and a high resistance to bending. If necessary, on one side or both sides of the transparent substrate film, a corona discharge treatment can be carried out or one or two easy-to-adhere pressure sensitive adhesive layers can be provided.

The electromagnetic wave-shielding film can be prepared, for example, by a method comprising placing a metal foil on one surface of a transparent substrate film carrying thereon an adhesive for a metal foil, and etching the metal foil to form a metal foil mesh. As a metal foil, there may be mentioned a foil of a metal such as copper, iron, nickel, or chromium, or an alloy thereof, or an alloy containing one or more abovementioned metals as main components. The metal foil is not particularly limited, but a copper foil is preferable because an electromagnetic wave can be effectively shielded, an etching procedure can be easily conducted, and the workability is good.

The thickness of the metal foil is preferably 1 μm to 100 μm, more preferably 5 μm to 20 μm. If the thickness is less than 1 μm, an electromagnetic wave cannot be sufficiently shielded. If the thickness is more than 100 μm, side-etching proceeds and cannot be ignored, and thus, it is difficult to form pores in an accurate manner. The metal foil may have a blackened layer formed by a blackening treatment on the side of the transparent substrate film, to impart not only an anti-corrosive property but also an anti-reflective property. A chromate treatment can be carried out on the blackened layer as an anticorrosive treatment. When a metal foil without a pre-blackening treatment is used, a blackening treatment can be carried out at any one of the subsequent steps. The blackened layer also can be formed by forming a photosensitive resin layer, which may be a resist layer, from a black-colored composition, carrying out an etching, and allowing the resist layer to remain. Alternatively, a metal plating can be used to form a black coating.

When a film of an ethylene-vinyl acetate copolymer resin having a high thermofusibility or a thermofusible resin such as an ionomer resin is used alone or in combination with another resin film as a laminate, the transparent substrate film and the metal foil can be laminated without an adhesive layer therebetween. In general, however, the lamination is carried out by a dry laminate method or the like, using an adhesive. As the adhesive for a metal foil forming the adhesive layer for a metal foil, there may be mentioned, for example, an adhesive, such as an acrylic resin, a polyester resin, a polyurethane resin, a polyvinyl alcohol resin, a vinyl chloride/vinyl acetate copolymer resin, or a ethylene/vinyl acetate copolymer resin. In addition, a thermosetting resin or a radiation-curable resin, such as a ultraviolet ray-curable resin, an electron radiation-curable resin can be used.

The metal foil on the resulting laminate is etched to form thick pores, whereby a mesh is formed. Thus, an electromagnetic wave-shielding film, which is a laminate of the transparent substrate film, the adhesive layer, and the metal foil mesh can be obtained.

In the electromagnetic wave-shielding film, the metal foil mesh, which is one of the subjects to be stuck with the pressure sensitive adhesive of the present invention, is required to have a transmittability, and an aperture ratio of the metal foil mesh used is generally 65 to 95%. The aperture ratio means a ratio of a transmittable portion without the metal foil to an area of the metal foil mesh. The thickness of the metal foil mesh is preferably 1 μm to 100 μm, more preferably 5 μm to 20 μm.

The pressure sensitive adhesive of the present invention can be applied on the side of the metal foil mesh of the electromagnetic wave-shielding film or the surface of the optically functional film by any known methods, to thereby form a film carrying the pressure sensitive adhesive. The pressure sensitive adhesive can be applied, for example, by a method comprising forming a layer of the pressure sensitive adhesive of the present invention on a releasable surface of the release sheet by a known applying method, and laying the layer of the pressure sensitive adhesive on the side of the metal foil mesh or the surface of the optically functional film to transfer the layer thereto, or a method comprising applying the pressure sensitive adhesive on the side of the metal foil mesh or the surface of the optically functional film by a known applying method. The applying method may be, for example, a roll coater, a knife coater, a die coater, a blade coater, a gravure coater, a screen printing, or the like.

After the pressure sensitive adhesive of the present invention is applied on the side of the metal foil mesh of the electromagnetic wave-shielding film or the surface of the optically functional film, it is subjected to an autoclaving treatment in the state that it is stuck to the metal foil mesh side and the optically functional film surface. The autoclaving treatment can be carried out by a known method, for example, at 40 to 80° C., under the pressure of 0.3 to 1.5 MPa. Preferably, the pressure sensitive adhesive is applied at a thickness such that it can entirely cover the metal foil mesh. The thickness of the resulting pressure sensitive adhesive after the autoclaving treatment is preferably 20 μm to 100 μm, more preferably 20 μm to 40 μm.

As the optically functional film, there may be mentioned, for example, a film absorbing a near infrared or infrared light, a film absorbing a neon light, a film absorbing an ultraviolet light, a film preventing or alleviating a leakage of an electromagnetic wave in addition to the metal foil mesh, a film inhibiting a reflection of an outside light, or a film adjusting a color tone. Further, a film protecting a glass surface of a display panel, or a film preventing a glass from shattering also can be stuck. A substrate of the optically functional film may be a film of polyethylene terephthalate, polymethyl methacrylate, polycarbonate or the like. The thickness of the substrate is about 20 μm to 300 μm.

The display panel filter element according to the present invention comprises
(1) the electromagnetic wave-shielding film, the film being a laminate of
(a) the transparent substrate film,
(b) the adhesive for a metal foil, the adhesive (b) being applied on one surface of the transparent substrate film(a), and
(c) the metal foil mesh formed on the adhesive (b) for a metal foil,
(2) the pressure sensitive adhesive, which is applied so as to cover the metal foil mesh of the electromagnetic wave-shielding film, and
(3) the optically functional film provided on the pressure sensitive adhesive.

The display panel filter element can be used as a component of a plasma display panel or the like.

EXAMPLES

The present invention will now be further illustrated by, but is by no means limited to, the following Examples.

Example 1

To 200 parts by mass of ethyl acetate, 64.5 parts by mass of n-butyl acrylate, 30 parts by mass of methyl acrylate, 0.5 part by mass of 2-hydroxyethyl acrylate, and 5 parts by mass of acryloyl morpholine as monomer components, and 0.2 parts by mass of azobisisobutyronitorile as an initiator were added. The whole was stirred at 60° C. for 17 hours to obtain a solution of acrylate ester copolymer having a weight-average molecular weight of 850 thousand. To the resulting copolymer solution, a trifunctional adduct based on xylenediisocyanate [TD-75: manufactured by Soken Chemical & Engineering Co., Ltd.] was added as a cross-linking agent at an amount of 0.5 part by mass with respect to 100 parts by mass of solid content of the copolymer solution. The whole was diluted with 2-butanone to a solution having a concentration of 25% by mass, to thereby obtain a solution of a pressure sensitive adhesive. A glass-transition temperature of acryloyl morpholine homopolymer was 145° C.

The resulting solution of the pressure sensitive adhesive was coated on a releasable surface of a release film [SP-PET3811: manufactured by LINTEC Corporation] by a knife coater, and dried at 90° C. for one minute to obtain a layer of the pressure sensitive adhesive with a thickness of 25 μm. A polyethylene terephthalate film [CosmoshineA4300: manufactured by Toyobo Co., Ltd.] with a thickness of 100 μm was laminated as a substrate of an optically functional film to obtain a film carrying the pressure sensitive adhesive.

Example 2

The procedure of Example 1 was repeated, except that 59.5 parts by mass of n-butyl acrylate, 30 parts by mass of methyl acrylate, 0.5 part by mass of 2-hydroxyethyl acrylate, and 10 parts by mass of acryloyl morpholine were used as monomer components, to obtain a film carrying a pressure sensitive adhesive. A weight-average molecular weight of the resulting acrylate ester copolymer was 850 thousand.

Example 3

The procedure of Example 1 was repeated, except that 54.5 parts by mass of n-butyl acrylate, 30 parts by mass of methyl acrylate, 0.5 part by mass of 2-hydroxyethyl acrylate, and 15 parts by mass of acryloyl morpholine were used as monomer components, to obtain a film carrying a pressure sensitive adhesive. A weight-average molecular weight of the resulting acrylate ester copolymer was 850 thousand.

Example 4

The procedure of Example 1 was repeated, except that 49.5 parts by mass of n-butyl acrylate, 30 parts by mass of methyl acrylate, 0.5 part by mass of 2-hydroxyethyl acrylate, and 20 parts by mass of acryloyl morpholine were used as monomer components, to obtain a film carrying a pressure sensitive adhesive. A weight-average molecular weight of the resulting acrylate ester copolymer was 850 thousand.

Example 5

The procedure of Example 1 was repeated, except that 64.5 parts by mass of n-butyl acrylate, 30 parts by mass of methyl acrylate, 0.5 part by mass of 2-hydroxyethyl acrylate, and 5 parts by mass of N,N-dimethyl acrylamide were used as monomer components, to obtain a film carrying a pressure sensitive adhesive. A weight-average molecular weight of the resulting acrylate ester copolymer was 800 thousand. A glass-transition temperature of the homopolymer of N,N-dimethyl acrylamide was 119° C.

Example 6

The procedure of Example 1 was repeated, except that 59.5 parts by mass of n-butyl acrylate, 30 parts by mass of methyl acrylate, 0.5 part by mass of 2-hydroxyethyl acrylate, and 10 parts by mass of N,N-dimethyl acrylamide were used as monomer components, to obtain a film carrying a pressure sensitive adhesive. A weight-average molecular weight of the resulting acrylate ester copolymer was 800 thousand.

Example 7

The procedure of Example 1 was repeated, except that 54.5 parts by mass of n-butyl acrylate, 30 parts by mass of methyl acrylate, 0.5 part by mass of 2-hydroxyethyl acrylate, and 15 parts by mass of N,N-dimethyl acrylamide were used as monomer components, to obtain a film carrying a pressure sensitive adhesive. A weight-average molecular weight of the resulting acrylate ester copolymer was 800 thousand.

Example 8

The procedure of Example 1 was repeated, except that 49.5 parts by mass of n-butyl acrylate, 30 parts by mass of methyl acrylate, 0.5 part by mass of 2-hydroxyethyl acrylate, and 20 parts by mass of N,N-dimethyl acrylamide were used as monomer components, to obtain a film carrying a pressure sensitive adhesive. A weight-average molecular weight of the resulting acrylate ester copolymer was 800 thousand.

Example 9

The procedure of Example 1 was repeated, except that 59 parts by mass of n-butyl acrylate, 30 parts by mass of methyl acrylate, 1 part by mass of 2-hydroxyethyl acrylate, and 10 parts by mass of acryloyl morpholine were used as monomer components, to obtain a film carrying a pressure sensitive adhesive. A weight-average molecular weight of the resulting acrylate ester copolymer was 800 thousand.

Example 10

The procedure of Example 1 was repeated, except that 58 parts by mass of n-butyl acrylate, 30 parts by mass of methyl acrylate, 2 parts by mass of 2-hydroxyethyl acrylate, and 10 parts by mass of acryloyl morpholine were used as monomer components, to obtain a film carrying a pressure sensitive adhesive. A weight-average molecular weight of the resulting acrylate ester copolymer was 800 thousand.

Example 11

The procedure of Example 1 was repeated, except that 57 parts by mass of n-butyl acrylate, 30 parts by mass of methyl acrylate, 3 parts by mass of 2-hydroxyethyl acrylate, and 10 parts by mass of acryloyl morpholine were used as monomer components, to obtain a film carrying a pressure sensitive adhesive. A weight-average molecular weight of the resulting acrylate ester copolymer was 800 thousand.

Example 12

The procedure of Example 1 was repeated, except that 54 parts by mass of n-butyl acrylate, 30 parts by mass of methyl acrylate, 1 part by mass of 2-hydroxyethyl acrylate, and 10 parts by mass of acryloyl morpholine were used as monomer components, to obtain a film carrying a pressure sensitive adhesive. A weight-average molecular weight of the resulting acrylate ester copolymer was 800 thousand.

Comparative Example 1

The procedure of Example 1 was repeated, except that 49.5 parts by mass of n-butyl acrylate, 30 parts by mass of methyl acrylate, 20 parts by mass of methyl methacrylate, and 0.5 part by mass of 2-hydroxyethyl acrylate were used as monomer components, to obtain a film carrying a pressure sensitive adhesive. A weight-average molecular weight of the resulting acrylate ester copolymer was 800 thousand.

Comparative Example 2

The procedure of Example 1 was repeated, except that 79 parts by mass of n-butyl acrylate, 20 parts by mass of methyl acrylate, and 1 part by mass of 2-hydroxyethyl acrylate were used as monomer components, to obtain a film carrying a pressure sensitive adhesive. A weight-average molecular weight of the resulting acrylate ester copolymer was 900 thousand.

[Evaluation of Properties]

(1) Preparation of a Laminate Film of a Copper Mesh

A copper mesh-laminated film was prepared as an electromagnetic wave-shielding film to be used in the following evaluation of properties, as follows:

A polyethylene terephthalate film [Cosmoshine A4100: manufactured by Toyobo Co., Ltd.] with a thickness of 100 µm was stuck to a copper foil having a blackened surface [BW-S: manufactured by Furukawa Circuit Foil Co., Ltd] with a thickness of 10 µm on the surface opposite to the blackened side, with an adhesive based on a polyurethane resin [mixture of Takelac A310 (main component)/Takenate A10 (curing agent)/ethyl acetate=12/1/21(mass ratio): manufactured by Takeda Pharmaceutical Co., Ltd.] for a metal foil, to obtain a laminate of the polyethylene terephthalate film/the layer of the adhesive for a metal foil/the copper foil.

A resist solution containing casein as a main ingredient was coated on the copper foil side of the resulting laminate and dried to form a photosensitive resin layer. A mask with a pattern was used to conduct a contact exposure with an ultraviolet ray. Then, the laminate was developed with water, cured, and baked at 100° C. to form a resist pattern. The mask used had a pattern with pitches of 300 µm and line widths of 10 µm. The laminate with the resulting resist pattern was etched on the resist pattern side by spraying a ferric chloride solution (Baume degree=42; temperature=30° C.), and washed with water. After the resist was removed with an alkali solution, the laminate was washed and dried to obtain a copper mesh laminate, i.e., an electromagnetic wave-shielding film, composed of the polyethylene terephthalate film/the layer of the adhesive for a metal foil/the copper mesh. The aperture ratio of the copper foil was 80%, and the thickness of the copper foil was 10 µm.

(2) Method of Measuring an Adhesive Strength to the Copper Mesh

A sample having a width of 25 mm and a length of 240 mm was cut from each of the films carrying the pressure sensitive adhesive. After a release film was peeled therefrom, the film carrying the pressure sensitive adhesive was stuck to the copper mesh laminate on the copper mesh side. The whole was pressed in an autoclave (manufactured by Kurihara Manufactory Inc.) under 0.5 MPa at 70° C. for 30 minutes, and then allowed to stand at 23° C. under a relative humidity of 50% for 24 hours. Thereafter, an adhesive strength was measure by a tensile strength tester (Tensilon: manufactured by Orientec Co., Ltd.) at a peeling rate of 300 mm/min and a peeling angle of 180°. In all films prepared in Examples 1 to 12 and Comparative Examples 1 and 2, the peeling occurred at an interface between the pressure sensitive adhesive and the copper mesh.

(3) Method of Measuring an Adhesive Strength to a Glass

The procedure of the above item "(2) Method of measuring an adhesive strength to the copper mesh" was repeated, except that a non-alkali glass (1727: manufactured by Corning Inc.) was used instead of the copper mesh laminate as the adherend.

(4) Method of Measuring a Storage Elastic Modulus (G') and a Loss Elastic Modulus (G")

A specimen having a cylindrical layer (diameter=8 mm and thickness=3 mm) of the pressure sensitive adhesive on a release sheet was prepared by successively laminating thereon layers of the pressure sensitive adhesive released from a release film carrying thereon a layer (thickness=25 µm) of the pressure sensitive adhesive. Then, a storage elastic modulus (G') and a loss elastic modulus (G") were measured by a torsional shear testing method under the following conditions:

Measuring apparatus: an apparatus for measuring a dynamic viscoelasticity [DYNAMIC ANALYZER RDAII: manufactured by Rheometric Co., Ltd.]

Frequency: 1 Hz

Temperature: 23° C., and 70° C.

(5) Method of Calculation of a Loss Tangent (Tan δ)

A loss tangent (tan δ) can be calculated from a storage elastic modulus (G') and a loss elastic modulus (G") by the following equation:

$$\text{loss tangent} = \text{loss elastic modulus}/\text{storage elastic modulus}$$

(6) Existence or Nonexistence of Bubbles

A sample having a width of 50 mm and a length of 120 mm was cut from each of the films carrying the pressure sensitive adhesive. After a release film was peeled therefrom, the film carrying the pressure sensitive adhesive was stuck to the copper mesh laminate on the copper mesh side. The whole was pressed in an autoclave (manufactured by Kurihara Manufactory Inc.) under 0.5 MPa at 70° C. for 30 minutes, and then the existence or nonexistence of bubbles was visually observed. The results were evaluated as follows:

o: No defect in appearance;

x: bubbles existed at an interface between the pressure sensitive adhesive layer and the copper mesh.

(7) Method of Evaluating Durability

A sample having a width of 50 mm and a length of 120 mm was cut from each of the films carrying the pressure sensitive adhesive. After a release film was peeled therefrom, the film carrying the pressure sensitive adhesive was stuck to the copper mesh laminate on the copper mesh side. The whole was pressed in an autoclave (manufactured by Kurihara Manufactory Inc.) under 0.9 MPa at 70° C. for 60 minutes, and then allowed to stand at 23° C. under a relative humidity of 90% for 24 hours, and further, at 80° C. under a relative humidity of 50% for 24 hours. Thereafter, the appearance was visually evaluated as follows:

••No defect in appearance;

o: No bubble having a maximum diameter of 100 µm or more was observed;

x: Bubble having a maximum diameter of 100 µm or more was observed.

(8) Method of Evaluating Corrosion Resistance

A sample having a width of 50 mm and a length of 120 mm was cut from each of the films carrying the pressure sensitive adhesive. After a release film was peeled therefrom, the film carrying the pressure sensitive adhesive was stuck to the copper mesh laminate on the copper mesh side. The whole was pressed in an autoclave (manufactured by Kurihara Manufactory Inc.) under 0.5 MPa at 70° C. for 30 minutes (pressure conditions 1), or under 0.9 MPa at 70° C. for 60 minutes (pressure conditions 2) to obtain specimens for evaluation. Before and after the specimen was allowed to stand at 60° C. under a relative humidity of 90% for 500 hour, transmittances at a wave length of 700 nm were measured by a spectrophotometer [MPC3100: manufactured by Shimadzu Corp.], and a difference of transmittance rate (ΔY) of the specimen was calculated. When ΔY was not more than 1.5%, a corrosion resistance was good.

(9) Results of Evaluation

The results of the evaluation are shown in the following Table 1.

TABLE 1

| | Adhesive strength (N/25 mm) | | Storage elastic modulus (Pa) | | Peak temperature of tan δ (° C.) | Bubbles | Durability | Corrosion resistance (Pressure conditions 1) ΔY(%) 700 nm 60° C. 90% RH 500 h | Corrosion resistance (Presssure conditions 2) ΔY(%) 700 nm 60° C. 90% RH 500 h |
|---|---|---|---|---|---|---|---|---|---|
| | on copper mesh | on glass | 23° C. | 70° C. | | | | | |
| Example 1 | 22.8 | 23.0 | $2.82 \times 10^5$ | $1.02 \times 10^5$ | −10.0 | ○ | ○ | 0.28 | 0.28 |
| Example 2 | 25.0 | 25.0 | $3.15 \times 10^5$ | $1.26 \times 10^5$ | −1.5 | ○ | ○ | 0.40 | 0.41 |
| Example 3 | 29.0 | 34.0 | $4.56 \times 10^5$ | $1.56 \times 10^5$ | 5.0 | ○ | ○ | 0.31 | 0.33 |
| Example 4 | 36.3 | 36.0 | $7.47 \times 10^5$ | $1.33 \times 10^5$ | 15.0 | ○ | ○ | 0.66 | 0.66 |
| Example 5 | 22.0 | 23.0 | $2.11 \times 10^5$ | $7.67 \times 10^4$ | −11.0 | ○ | ○ | 0.34 | 0.34 |
| Example 6 | 28.0 | 25.0 | $2.19 \times 10^5$ | $8.34 \times 10^4$ | −3.0 | ○ | ○ | 0.52 | 0.55 |
| Example 7 | 37.5 | 34.0 | $3.27 \times 10^5$ | $9.66 \times 10^4$ | 2.7 | ○ | ○ | 0.48 | 0.51 |
| Example 8 | 41.7 | 36.0 | $6.79 \times 10^5$ | $1.42 \times 10^5$ | 10.1 | ○ | ○ | 0.51 | 0.51 |
| Example 9 | 27.5 | 20.5 | $2.55 \times 10^5$ | $1.12 \times 10^5$ | −2.0 | ○ | ◎ | 0.25 | 0.26 |
| Example 10 | 29.0 | 19.5 | $2.74 \times 10^5$ | $1.32 \times 10^5$ | −1.0 | ○ | ◎ | 0.22 | 0.21 |
| Example 11 | 41.5 | 20.5 | $2.67 \times 10^5$ | $9.61 \times 10^5$ | 4.9 | ○ | ◎ | 0.34 | 0.35 |
| Example 12 | 31.0 | 28.0 | $4.86 \times 10^5$ | $1.56 \times 10^5$ | 17.0 | ○ | ◎ | 0.35 | 0.37 |
| Comparative Example 1 | 25.0 | 25.0 | $1.43 \times 10^5$ | $5.54 \times 10^4$ | −3.0 | X | X | 0.38 | 0.41 |
| Comparative Example 2 | 13.4 | 12.0 | $8.28 \times 10^4$ | $4.46 \times 10^4$ | −25.0 | X | X | 0.52 | 0.55 |

The pressure sensitive adhesive of the present invention can be used, for example, in the manufacture of a display panel filter element constituting a plasma display panel or the like, and in the manufacture of a display using the same.

As above, the present invention was explained with reference to particular embodiments, but modifications and improvements obvious to those skilled in the art are included in the scope of the present invention.

What we claim are:

1. A method for manufacturing a display panel filter element, comprising:
   sticking together an electromagnetic wave-shielding film and an optically functional film with a pressure sensitive adhesive under a pressure of 0.3 to 1.5 MPa at 40 to 80° C., to produce said display panel filter element having
   (1) said electromagnetic wave-shielding film, said film being a laminate of a transparent substrate film, an adhesive for a metal foil, and a metal foil mesh formed on said adhesive for a metal foil, said adhesive being applied on one surface of said transparent substrate film, an aperture ratio of said metal foil mesh being 65 to 95% and the thickness of said metal foil mesh being 1 μm to 20 μm,
   (2) a layer of said pressure sensitive adhesive, said pressure sensitive adhesive being applied so as to cover said metal foil mesh of said electromagnetic wave-shielding film, and
   (3) said optically functional film provided on said pressure sensitive adhesive; wherein
   said pressure sensitive adhesive has a storage elastic modulus at 70° C. of $7.00 \times 10^4$ Pa to $1.00 \times 10^6$ Pa and a storage elastic modulus at 23° C. of $1.00 \times 10^5$ Pa or more,
   said pressure sensitive adhesive comprises an acrylic copolymer prepared from comonomers comprising (meth)acrylic alkyl ester and nitrogen-containing vinyl,
   said comonomers further comprise hydroxyalkyl (meth)acrylate as a monomer containing a cross-linking functional group,
   said optically functional film is selected from the group consisting of a film absorbing a near infrared or infrared light, a film absorbing a neon light, a film absorbing an ultraviolet light, a film preventing or alleviating a leakage of an electromagnetic wave in addition to the metal foil mesh, a film inhibiting a reflection of an outside light, and a film adjusting a color tone.

2. The method for manufacturing a display panel filter element according to claim 1, wherein a peak temperature of loss tangent (tan δ) of said pressure sensitive adhesive is −15° C. or more.

3. The method for manufacturing a display panel filter element according to claim 1, wherein said acrylic copolymer does not contain an acid comonomer.

4. The method for manufacturing a display panel filter element according to claim 1, wherein said nitrogen-containing vinyl is acryloyl morpholine.

5. The method for manufacturing a display panel filter element according to claim 1, wherein a ratio of said nitrogen-containing vinyl to all the comonomers is 0.1 to 30.0% by mass.

6. The method for manufacturing a display panel filter element according to claim 1, wherein a ratio of said hydroxyalkyl (meth)acrylate to all the comonomers is 0.2 to 10% by mass.

* * * * *

UNITED STATES PATENT AND TRADEMARK OFFICE
CERTIFICATE OF CORRECTION

PATENT NO. : 8,470,123 B2  
APPLICATION NO. : 13/560588  
DATED : June 25, 2013  
INVENTOR(S) : Matano et al.

Page 1 of 1

It is certified that error appears in the above-identified patent and that said Letters Patent is hereby corrected as shown below:

In the Specification:

Column 5, line 9: Delete "mide···" and insert --mide;--

Column 5, Line 12: Delete "(meth)acrylate···" and insert --(meth)acrylate;--

Column 12, Line 43: Delete "···No defect in appearance" and insert --  : No defect in appearance--

Signed and Sealed this  
Tenth Day of September, 2013

Teresa Stanek Rea  
*Acting Director of the United States Patent and Trademark Office*